United States Patent [19]

Crivello

[11] Patent Number: 4,689,289

[45] Date of Patent: Aug. 25, 1987

[54] BLOCK POLYMER COMPOSITIONS

[75] Inventor: James V. Crivello, Clifton Park, N.Y.

[73] Assignee: General Electric Company, Schenectady, N.Y.

[21] Appl. No.: 857,662

[22] Filed: Apr. 30, 1986

[51] Int. Cl.$^4$ ............... G03C 1/495; C08F 2/50; C08F 30/08; C08F 230/08

[52] U.S. Cl. ............... 430/270; 430/326; 430/913; 430/921; 430/925; 522/31; 522/99; 522/148; 525/326.5; 525/337; 525/340; 525/479

[58] Field of Search ........... 525/479, 326.5; 522/31; 430/270, 326

[56] References Cited

U.S. PATENT DOCUMENTS

| | | | |
|---|---|---|---|
| 4,307,177 | 12/1981 | Crivello | 522/31 |
| 4,491,628 | 1/1985 | Willson | 430/176 |
| 4,584,356 | 4/1986 | Crivello | 525/479 |

Primary Examiner—Wilbert J. Briggs, Sr.
Assistant Examiner—D. W. Woodward
Attorney, Agent, or Firm—William A. Teoli; James C. Davis, Jr.; James Magee, Jr.

[57] ABSTRACT

Block polymer compositions are provided which are useful as positive or negative resists utilizing aryl onium salts in combination with silicone-organic block polymers, such as polydimethylsiloxane-poly-t-butylmethacrylate block polymers. A silicone prepolymer is used in combination with certain polymerizable vinyl monomers such as t-butylmethacrylate. The silicone prepolymer has chemically combined pinacolate groups in the backbone or terminal positions which are capable of generating free-radicals upon thermolysis.

15 Claims, No Drawings

BLOCK POLYMER COMPOSITIONS

BACKGROUND OF THE INVENTION

Prior to the present invention, the general method for making silicone-styrene block polymers, as shown by J. Saam et al, U.S. Pat. No. 3,678,125, incorporated herein by reference, involved the preparation of a block of polystyrene having terminal organometallic functional groups resulting from anionic polymerization. Silicone blocks were then grown off the ends of the vinyl polymer by means of anionic ring opening of a cyclic siloxane such as hexamethylcyclotrisiloxane. The resulting ABA silicone-organic-silicone block polymer was then coupled to give a multiple sequence block polymer having good mechanical properties.

In my copending application, Ser. No. 840,168, filed Mar. 17, 1986, and assigned to the same assignee as the present invention and incorporated herein by reference, certain silicone-organic block polymers are shown which can be used as resists, impact modifiers, packaging, biomedical protheses and the like. These silicone-organic block copolymers can be made by effecting in the presence of an organic solvent, the free radical polymerization of a free radical polymerizable organic monomer and a silicone prepolymer having in its backbone or in the terminal position, at least one chemically combined bissilylpinacolate radical capable of forming a free radical-initiator upon thermolysis.

The present invention is based on my discovery that certain silicone-polyvinylarylene block copolymers which can be made by the aforementioned method of Saam et al, can be used as positive or negative resists. These silicone-polyvinylarylene block copolymers are shown by the formulas $$\{A-B\}_x \quad (1)$$

$$A-B-A \quad (2)$$

where A is a silicone block joined to B by carbon-silicon linkages and consists essentially of chemically combined diorganosiloxy units of the formula $$(R)_2SiO- \quad (3)$$

R is selected from monovalent $C_{(1-14)}$ hydrocarbon radicals and $C_{(1-14)}$ hydrocarbon radicals substituted with radicals neutral during anionic or free radical polymerization and B is a vinylarylene block consisting essentially of chemically combined vinylarylene units substituted with at least one acid labile group of the formula $$OZ \quad (4)$$

where Z is a tertiary organo or organosilicon radical as defined hereinafter and x is a positive integer.

The present invention is based further on my discovery that if a free radical polymerizable vinyl monomer having the formula, $$C(R^1)_2=\overset{R^2}{\underset{|}{C}}-Q, \quad (5)$$

where Q is a monovalent radical selected from, $-CO_2-Y$, $-R^3CO_2Y$, and $R^3OZ$, Z is as previously defined, and Y is an acid labile group as defined hereinafter, is polymerized in the presence of the silicone prepolymer of the above-mentioned Ser. No. 840,168, having at least one chemically combined bis-silylpinacolate radical, that the resulting silicone-organic block polymer also can be used as a positive or negative resist. I have further found that resist compositions sensitive to deep UV radiation in the range of from 220 to 320 nm can be made by combining the silicone-polystyrene block copolymers of Formulas (1) or (2), or the silicone-organic block polymers made by the method of Ser. No. 840,168, with an effective amount of an aryl onium salt as defined hereinafter to produce a resist composition. These resist compositions also exhibit valuable etch resistance to RIE, oxygen reactive ion etching. $R^1$ in Formula (5) is selected from hydrogen, a $C_{(1-8)}$ alkyl radical or a mixture thereof, $R^2$ is a $C_{(1-14)}$ monovalent hydrocarbon or a $C_{(1-14)}$ hydrocarbon radical substituted with radicals neutral during polymerization, and $R^3$ is selected from $C_{(6-14)}$ aromatic hydrocarbon radicals and $C_{(6-14)}$ aromatic hydrocarbon radicals substituted with up to five nuclear bound radicals which can be the same or different and which are neutral during polymerization.

STATEMENT OF THE INVENTION

There is provided by the present invention, compositions comprising (A) silicone-organic block polymer selected from the class consisting of
  (i) block copolymers of Formulas (1) or (2), and
  (ii) a silicone-organic block polymer resulting from the free-radical polymerization, in the presence of organic solvent, of a free radical polymerizable organic monomer of Formula (5), and a silicone prepolymer consisting essentially of chemically combined diorganosiloxy units, and having in its backbone, or in the terminal position, at least one chemically combined bissilyl pinacolate radical capable of forming a free-radical initiator upon thermolysis, and (B) an effective amount of a decomposable aryl onium salt having at least one chemically combined anion capable of effecting acid catalyzed chemical transformation of the silicone-organic block polymer of (A) sufficient to alter its solubility characteristics. It is preferred that the aryl onium salt be radiation decomposable when exposed to electromagnetic or E-beam radiation.

Some of the silicone prepolymers used in the practice of the present invention which can be used to make the silicone-organic block polymers, can be made in the presence of a platinum catalyst, by effecting reaction between a silicon hydride terminated polydiorganosiloxane of the formula, $$H-\left(\underset{\underset{R^4}{|}}{\overset{\overset{R^4}{|}}{Si}}O\right)_n\underset{\underset{R^4}{|}}{\overset{\overset{R^4}{|}}{Si}}H, \quad (6)$$

and an aliphatically unsaturated triorganosilyl-substituted arylpinacol selected from

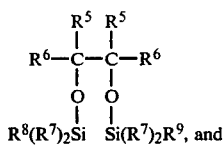
(7)

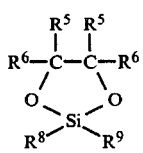
(8)

where R⁴ is a monovalent radical selected from $C_{(1-14)}$ hydrocarbon radicals and $C_{(1-14)}$ hydrocarbon radicals substituted with monovalent radicals neutral during free radical polymerization, R⁵ and R⁶ are monovalent radicals selected from $C_{(6-14)}$ aryl hydrocarbon radicals and $C_{(6-14)}$ aryl hydrocarbon radicals substituted with neutral radicals as previously defined, and and when attached to the same carbon atom, R⁵ and R⁶ can be joined together to form divalent aryl radicals selected from,

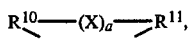

R⁷ is a monovalent radical selected from hydrogen and R⁴ radicals, R⁸ is selected from $C_{(2-20)}$ monovalent aliphatically unsaturated hydrocarbon radicals, and $C_{(2-20)}$ aliphatically unsaturated monovalent hydrocarbon radicals substituted with neutral radicals, $C_{(4-20)}$ cycloaliphatically unsaturated radicals and $C_{(4-20)}$ cycloaliphatically unsaturated organic radicals substituted with neutral radicals, R⁹ is selected from R⁷ radicals and R⁸ radicals, R¹⁰ and R¹¹ are selected from divalent $C_{(6-14)}$ aryl hydrocarbon radicals and divalent $C_{(6-14)}$ aryl hydrocarbon radicals substituted with neutral radicals, X is selected from —O—, —S—, —CH₂, and

a is 0 or 1, and n is a whole number equal to 0 to 2000 inclusive.

Some of the acid labile groups included by Z are, for example, isopropyl, isobutyl, t-butyl, trimethylsilyl and t-butoxycarbonyloxy. Acid labile groups included by Y are Z groups and benzyl, α-methylbenzyl, t-butyl and α,α-dimethylbenzyl.

Radicals included within R of Formula (3) are, for example, $C_{(1-8)}$ alkyl radicals, such as methyl, ethyl, propyl, butyl, pentyl, hexyl, etc.; substituted $C_{(1-8)}$ alkyl radicals such as cyanoethyl, cyanobutyl, trifluoropropyl; aryl radicals such as phenyl, tolyl, xylyl, naphthyl; substituted aryl radicals, such as methoxyphenyl, chlorophenyl, nitrophenyl, chloronapthyl, etc.

Radicals included within R¹ and R² of Formula (5) are, for example, $C_{(1-8)}$ alkyl radicals such as methyl, ethyl, propyl, butyl, pentyl, which can be the same or different; R² includes R¹ radicals and $C_{(6-14)}$ aryl radicals for example, phenyl, tolyl, xylyl, naphthyl, chlorophenyl and nitrophenyl. Radicals included with R³ are, for example, phenylene, tolylene, xylylene, naphthylene, chlorophenylene, nitrotolylene, and methoxyphenylene.

Radicals included within R⁴ of Formula (6) are, for example, $C_{(1-8)}$ alkyl radicals, such as methyl, ethyl, propyl, butyl, pentyl, hexyl, etc.; substituted $C_{(1-8)}$ alkyl radicals such as cyanoethyl, cyanobutyl, trifluoropropyl; aryl radicals such as phenyl, tolyl, xylyl, naphthyl; substituted aryl radicals, such as methoxyphenyl, chlorophenyl, nitrophenyl, chloronaphthyl, etc. Radicals included within R⁵ and R⁶ of Formula (7) are, for example, phenyl, xylyl, tolyl, naphthyl, chlorophenyl, nitrophenyl, methoxyphenyl, etc. Radicals included within R⁸ of Formula (7) are, for example, vinyl, allyl, etc., cyclopentenyl, cyclohexenyl, nadic, etc. Radicals included within R¹⁰ and R¹¹ are, for example, phenylene, xylylene, naphthylene, tolylene, and substituted derivatives thereof, substituted with from 1–4 neutral radicals, such as chloro, nitro, and methoxy.

Some of the aliphatically unsaturated triorganosilyl substituted aryl pinacoles which can be used in the practice of the present invention to make silicon prepolymers are shown in Crivello, U.S. Pat. No. 4,535,174 assigned to the same assignee as the present invention and incorporated herein by reference. These aliphatically unsaturated triorganosilyl substituted aryl pinacoles can be made by effecting reaction between an appropriate ketone and an aliphatically unsaturated monohalosilane in the presence of an active metal reducing agent, such as magnesium, as shown by the following equation:

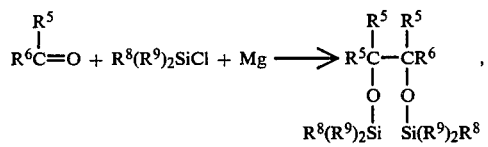

where R⁵, R⁶, R⁸ and R⁹ are as previously defined.

A similar procedure can be used for preparing cyclic silicone containing pinacolates which require the employment of a dihalo aliphatically unsaturated silane in combination with a ketone as shown by the following equation

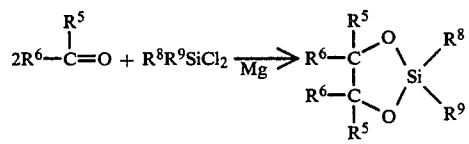

where R⁵, R⁶, R⁸ and R⁹ are as previously defined.

Silicone prepolymers which can be used to initiate the polymerization of the free-radical polymerizable organic monomer of Formula (5) can be made by effecting the transition metal catalyzed addition of a silicone hydride of Formula (6) and aliphatically unsaturated organosilyl pinacole ether of Formulas (7) or (8) as shown by the following, where m is a positive integer:

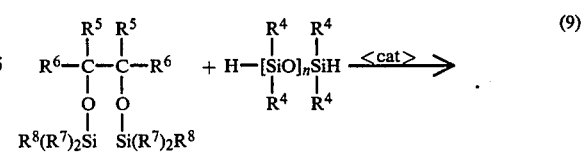
(9)

-continued

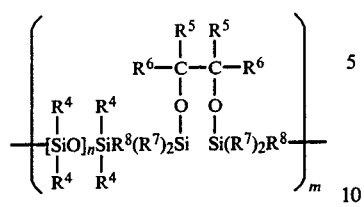

and $R^4$, $R^5$, $R^6$, $R^7$, $R^8$, and n are as previously defined.

A typical reaction scheme of making the silicone-organic block polymers in accordance with the practice of the method of the present invention can be illustrated as follows, where a free radical fragment is formed from a silicone prepolymer segment included within Formula (9), and M is a vinyl or diene monomer:

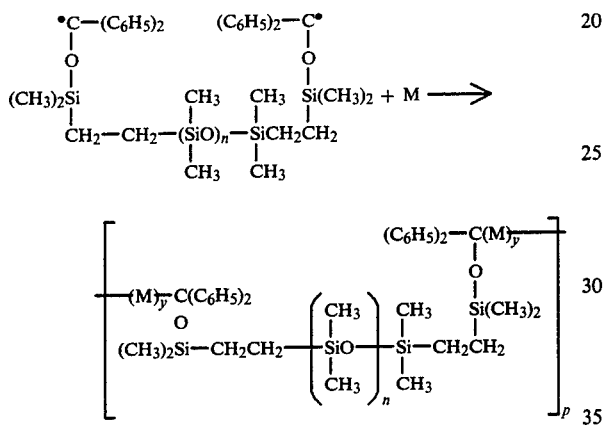

where n is as previously defined, and p is a positive integer having a value of from 1 to 2000 inclusive.

The silicone prepolymer of Formula (9) is thermally labile and when heated to temperatures above 40° C. in the presence of vinyl monomer initiates their free-radical polymerization. Typical vinyl monomers included within Formula (5) which can be polymerized in this manner are, for example, 4-t-butoxycarboxyloxystyrene, 4-t-butoxycarbonyloxy-α-methylstyrene, 4-vinyl-t-butylbenzoate, t-butylmethacrylate, t-butylacrylate, 3-t-butoxycarbonyloxystyrene, 4-t-butoxystyrene, 4-vinyl-α-methylbenzylbenzoate, 3-vinyl-α-dimethylbenzylbenzoate.

The polymerization can be facilitated by the use of an organic solvent such as toluene, benzene, xylene, acetonitrile, water, methylene chloride, nitromethane, ethyl benzene, dimethylformamide, acetic acid, chlorobenzene, nitrobenzene, etc.

Transition metal catalysts which can be used in the practice of the present invention to make the silicone prepolymers are preferably platinum catalysts, for example, platinum complexes of unsaturated siloxanes, as shown by Karstedt U.S. Pat. No. 3,775,442, Ashby U.S. Pat. Nos. 3,159,601 and 3,159,662 and Lamoreaux U.S. Pat. No. 3,220,972, assigned to the same assignee as the present invention. An effective amount of a platinum catalyst is about $10^{-4}\%$ to 0.1% by weight of platinum, based on the weight of polymerizable hydrosilation mixture.

Some of the aryl onium salts which can be used in the practice of the present invention are shown by Crivello, U.S. Pat. Nos. 4,058,401; 4,069,055; and 4,264,703; assigned to the same assignee as the present invention and incorporated herein by reference. Additional onium salt initiators which can be used are, for example:

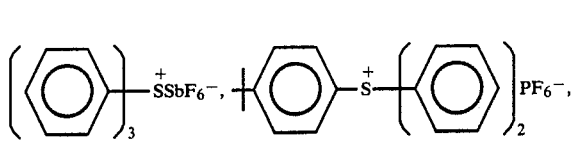

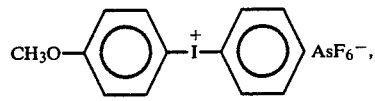

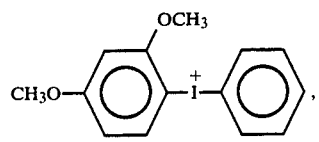

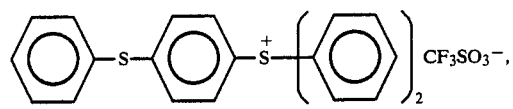

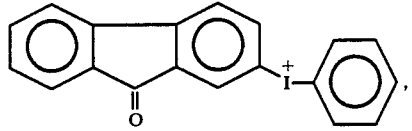

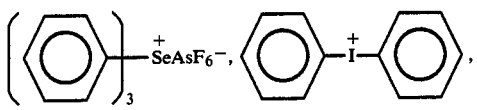

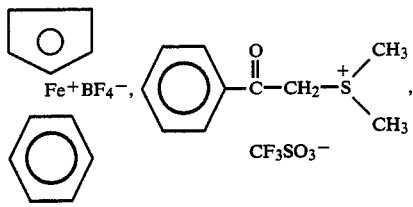

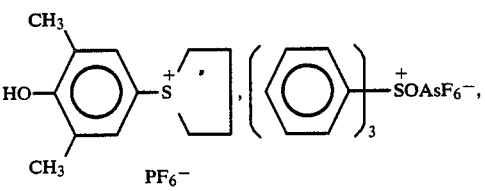

-continued

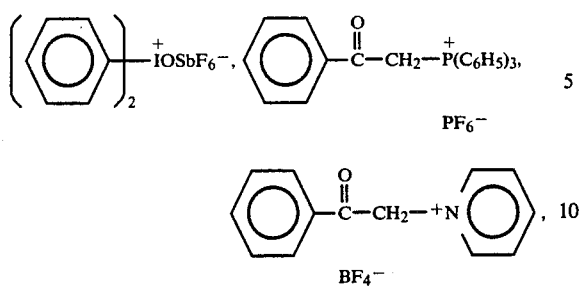

In addition to the above onium salts, photosensitizers for these salts may be used including aromatic ketones, dyes condensed aromatic hydrocarbons, etc.

The onium salt initiators are preferably decomposed by actinic radiation such as ultraviolet light. However, effective results can be achieved with E-beam particles and X-rays.

An effective amount of onium salt initiators is 0.1 to 20% by weight of initiator, based on the weight of resist composition.

There also can be used, if desired, from about 1% to 20% by weight of the polymerizable mixture of free radical, phenolic inhibitors, such as 4-t-butylcatechol, to control the degree of cross-linking.

The micro-structure of the silicone-organic block polymers of the present invention may be modified by introducing branching into the chains. This may be readily accomplished by the use of olefinic branching agents to produce branched prepolymer. Some of the branching agents which are useful for this purpose are, for example, triallylisocyanurate, 1,3,5-triallylbenzyltricarboxylate, glycerol triallylether, etc.

The silicone-organic block polymers which can be made in the practice of the present invention can be recovered by standard procedures such as precipitation after polymerization into a suitable organic solvent such as methanol, hexane, etc. Standard extraction techniques also can be used if desired.

In order that those skilled in the art will be better able to practice the invention, the following examples are given by way of illustration and not by way of limitation. All parts are by weight.

EXAMPLE 1

A mixture of 2177 grams (9.806 mole) of octamethylcyclotetrasiloxane, 16.75 gram (0.125 mole) of 1,1,3,3-tetramethyldisiloxane and 12 grams of Filtrol 20 acid treated clay was equilibrated at 60° C. for 20 hours utilizing a stirrer, reflux condenser and drying tube. The equilibrated mixture was then allowed to cool and was filtered through a sintered glass funnel to remove the clay. The reaction mixture was stripped of volatiles at 130°–140° C. at approximately 0.1 torr. Based on method of preparation and $^{29}$Si NMR, there was obtained a hydrogen terminated polydimethylsiloxane in the form of a viscous oil having a number average molecular weight of 9894 grams per mole which corresponded to a DP=133.7.

There was added dropwise with stirring, 60.5 grams (0.5 mole) of dimethylvinylchlorosilane to a mixture of 91.0 grams (0.5 mole) of benzophenone, 6 grams (0.25 mole) of magnesium metal (30 mesh), 250 ml of dry tetrahydrofuran and 15 ml of tetramethylurea. An exothermic reaction was noted with the temperature rising gradually to 50° C. The reaction mixture was kept at this temperature with the aid of a water bath. After the exothermic portion of the reaction had subsided, the reaction mixture was heated to 47° C. for 4 hours and then allowed to stand at room temperature overnight. The solvent was removed with the aid of a rotary evaporator and the yellow oil dissolved in chloroform. An inorganic precipitate was removed by filtration and a product was obtained which was recrystallized twice from ethanol. The yield of the colorless product having a melting point of 135°–140° C. was 56.3 g or 43.1% theory. The product was benzopinacole bis(dimethylvinylsilyl)ether having the formula

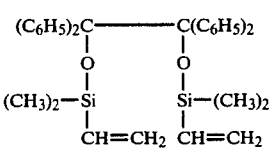

The identity of the compound was confirmed by elemental analysis: Calcuated: C; 76.40%, H; 7.12%, Si; 10.49%. Found: C; 75.9%, H; 7.20%, Si; 10.70%.

There were refluxed and stirred under nitrogen, 16.96 g of the previously prepared hydrogen terminated polydimethylsiloxane, having an average molecular weight of 1390 g/mol and 5 ml of dry toluene for about one hour to dry the reaction mixture. The mixture was cooled to 40° C. and 5.678 g of the above bis(dimethylvinylsilyl)benzopinacolate was added along with 8 μl of a platinum siloxane catalyst as shown by Karstedt, U.S. Pat. No. 3,715,334. The mixture was stirred for an additional two hours. Based on method of preparation, there was obtained a polydimethylsiloxane having chemically combined benzopinacolate radicals.

There were added, 50.88 g 4-t-butoxystyrene to the above polydimethylsiloxane and the temperature was raised to 100° C. over the course of one hour. Heating was continued for a total of 18 hours, then the solid polymer cooled, dissolved in methylene chloride and precipitated into methanol. The polymer was collected by filtration and redissolved in tetrahydrofuran and then precipitated into water, washed with water and then chopped in a Waring Blendor and then dried in vacuo at 60° C. The yield of polymer was 62.7 g or 85% theory. GPC analysis gave a number average molecular weight of 93,400 g/mol and a weight average molecular weight of 359,700 g/mol. Differential scanning calorimetry showed a glass transition temperature of 96° C. Based on method of preparation, there was obtained a silicone-polystyrene block copolymer having 4-t-butoxy radicals on the styrene backbone.

There was added to 1 g of the above silicone-styrene block polymer, 0.1 g of di(t-butylphenyl)iodonium hexafluoroantimonate photoinitiator and 6 ml 2-methoxypropylacetate. The photoresist solution was spun onto silicon wafers which had previously been treated with hexamethyldisilazane. The films were then baked at 90° C. for 30 minutes. Using a Suss MA56 contact-proximity printer, the wafers were subjected to imagewise exposure at 250 nm in the contact mode. Following exposure from 15–20 seconds, the wafers were baked at 130° C. for 1 minute. Well resolved negative tone images were obtained on immersing the wafers in methylene chloride for 1 minute.

EXAMPLE 2

There were refluxed for one hour with stirring, 11.3 g (0.0025 mol) α,ω-hydrogen functional polydimethylsiloxane having a molecular weight of 4520 g/mol and 4 mL toluene. The resulting dry reaction mixture was cooled to 40° C. There was added 1.281 g benzopinacole bis(dimethylvinylsilyl)ether and 8 μL platinum-siloxane catalyst. The silylpinacolate rapidly dissolved and an increase in the solution viscosity was noted. The reaction mixture was stirred at 40° C. for 2 hours, and 45 mL of t-butylmethacrylate was added and the mixture thoroughly purged with nitrogen gas. The temperature was slowly raised to 100° C. to initiate polymerization. After 2 hours at 100° C., the viscosity of the mixture had increased to the point at which the stirrer stalled. The resulting slightly opalescent reaction polymer was dissolved in dichloromethane and precipitated into methanol. A soft rubbery polymer was obtained by decanting off the solution and washing with more methanol. The polymer was air dried for 3 days and then dried at 60° C. in vacuo. There were obtained 40 g of a silicone block polymer consisting essentially of chemically combined polydimethylsiloxane blocks and poly-t-butylmethacrylate blocks. The block polymer had a glass transition temperature of 117° C.

There were added to 0.25 g of the block polymer, 0.1 g di(4-t-butylphenyl)iodonium trifluoromethanesulfonate and 3 mL CH$_2$Cl$_2$. The above photoresist solution was coated onto a 3" silicon wafer and bake dried. The wafer was then exposed to UV irradiation from a GE H3T7 medium pressure mercury arc lamp at a distance of 6 inches for 5 seconds. After irradiation, the wafer was baked in a forced air oven for one minute at 115° C. A visible relief image was observed at this point. The wafer was developed by immersing it for one minute in a 1.6N solution of sodium hydroxide. A sharp, cleared, positive image of the mask was obtained.

Further imaging experiments were also carried out. A photoresist solution was prepared by dissolving 0.5 g of the above polymer together with 0.05 g di-(4-t-butylphenyl)iodonium hexafluoroantimonate in 6 mL 2-methoxypropyl acetate. This solution was spun onto 4 inch silicon wafers which had been previously baked and treated with hexamethylsilazane. The wafers were then subjected to imagewise irradiation using a multidensity mask and a Suss MA 56 contact/proximity aligner operated in the contact mode at 250 nm. Excellent positive patterns were obtained after 15 seconds exposure (approx. 80 mJ/cm$^2$) followed by a one minute postbake at 130° C. The wafers were then developed using a commercial developer (KTI 351 positive developer 100% KTI Corp.) for one minute. Features down to 2 micrometers were resolved while cleared 3.5 micrometer features with equal lines and spaces were obtained.

EXAMPLE 3

A mixture of 11.3 g (0.0025 mol) of an α,ω-hydrogen functional siloxane having a number average molecular weight of 4520 g/mol and 4 mL toluene was azeotroped for one hour. The mixture was then cooled to 30° C. and 1.281 g (0.0025 mol) bis(dimethylvinylsilyl)benzopinacolate and 8 μL platinum-siloxane catalyst were added. The temperature of the reaction mixture was brought to 40° C. and polymerization carried out for two hours. Next, 46 g of α-methylbenzylmethacrylate was added and the reaction mixture thoroughly purged with nitrogen.

The reaction mixture was slowly heated to 100° C. to initiate polymerization. After 8 hours, the polymerization was terminated by cooling and the resulting product dissolved in methylene chloride. The product was isolated by pouring the solution into methanol, collecting the white product by filtration, washing with methanol, and finally drying overnight at 60° C. in vacuo. Based on method of preparation, the product was a polydimethylsiloxanepolymethylmethacrylate block polymer having chemically combined methylbenzyl carboxylate groups on the polymethylmethacrylate backbone. The yield of block polymer was 79%.

A photoresist solution was prepared using 0.5 g of the above block polymer, 0.1 g 4-t-butylcatechol, 0.05 g di(t-butylphenyl)iodonium hexafluoroantimonate and 6 mL 2-methoxypropylacetate. The resist solution was spin coated onto 3 inch diameter silicon wafers which had previously been treated with hexamethyldisilazane. The wafers were then baked in a forced air oven at 90° C. for 30 minutes. Imagewise exposure was then carried out using a Suss MA56 operated in the contact mode at 250 nm and using a multidensity quartz mask. Optimum exposure, bake and development conditions consisted of a 1-5 second exposure followed by a 15-30 second bake at 130° C. The wafers were then immersion developed for 30-60 seconds in KTI 351 developer solution. Under these conditions, cleared, highly resolved 2 μm images were obtained.

Although the above examples are directed to only a few of the very many variables which can be utilized in the practice of the method of the present invention, it should be understood that the present invention is directed to a method for making a much broader variety of silicone-organic block polymers and aryl onium salts as shown in the description preceding these examples and photoresist compositions obtained therefrom. Preferably, the aryl onium salts are triarylsulfonium such as triphenylsulfonium, thiophenoxydiphenylsulfonium, bis[4-(diphenylsulfonio)phenyl]sulfide and diaryliodonium such as diphenyliodonium and the preferred anions are perchlorate, fluoroborate, trifluoromethanesulfonate and MF$_6^-$, where M is selected from phosphorus, arsenic, and antimony. The vinyl monomers of formula (1) also can be employed as mixtures including combinations with up to about 30 mole percent based on the total moles of monomers in the mixture of other free radical polymerizable vinyl monomers such as 4-bromostyrene, 4-chlorostyrene, and the like. In addition, it has been found that in order to provide improved etch resistance and desirable resist characteristics in the block polymer compositions of the present invention, there can be utilized from about 5% to 80% by weight, and preferably 10% to 30% by weight of silicone based on the weight of block polymer composition.

What I claim as new and desire to secure by Letters Patent of the United States is:

1. A composition comprising
   (A) a silicone-organic block polymer resulting from the free-radical polymerization in the presence of organic solvent of a free radical polymerizable organic monomer of the formula

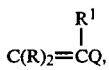

and a silicone prepolymer consisting essentially of chemically combined diorganosiloxy units and having in its backbone or in the terminal position, at least one chemically combined bissilyl pinacolate radical capable of forming a free-radical initiator upon thermolysis, and (B) an amount of a decomposable aryl onium salt having at least one chemically combined onium anion which is effective for producing the acid catalyzed chemical transformation of the silicone-organic block polymer sufficient to alter its solubility characteristics when exposed to electromagnetic or particle radiation, where R is selected from hydrogen, a $C_{(1-8)}$ alkyl radical, or a mixture thereof, $R^1$ is a $C_{(1-14)}$ monovalent hydrocarbon radical or hydrocarbon radical substituted with radicals, neutral during polymerization, Q is a monovalent radical selected from —$CO_2$—Y, —$R^2CO_2Y$, and $R^2OZ$, Y and Z are acid labile radicals, and $R^2$ is selected from $C_{(6-14)}$ aromatic hydrocarbon radicals and $C_{(6-14)}$ aromatic hydrocarbon radicals substituted with up to five nuclear bound radicals which can be the same or different and neutral during free radical polymerization.

2. A composition in accordance with claim 1, where the aryl onium salt is a diaryliodonium salt having an anion selected from hexafluoroarsenate, trifluoromethanesulfonate, hexafluoroantimonate, or hexafluorophosphate.

3. A composition in accordance with claim 1, where the aryl onium salt is a triarylsulfonium salt having an anion selected from hexafluoroarsenate, trifluoromethanesulfonate, fluoroborate, hexafluoroantimonate, or hexafluorophosphate.

4. A composition in accordance with claim 1 where the free radical polymerizable organic monomer is 4-t-butoxystyrene.

5. A composition in accordance with claim 1, where the free radical polymerized organic monomer is t-butylmethacrylate.

6. A composition in accordance with claim 2, where the diaryliodonium salt is di-4-(t-butylphenyl)iodonium hexafluoroantimonate.

7. A composition in accordance with claim 3, where the triarylsulfonium salt is triphenylsulfonium hexafluoroantimonate.

8. A composition in accordance with claim 1 which is a resist composition.

9. A resist composition in accordance with claim 1 where the catalyst consists of a combination of an onium salt and a sensitizer.

10. A composition in accordance with claim 1 which is a photoresist composition.

11. A composition in accordance with claim 1 where the silicone block of the silicone organic block polymer is a polydimethyl siloxane.

12. A resist composition comprising (C) a silicone-organic block polymer having the formula (A—B)$_x$, or

A—B—A, where A is a silicone block joined to B by carbon-silicon linkages and consists essentially of chemically combined diorganosiloxy units of the formula (R)$_2$SiO, R is selected from monovalent $C_{(1-14)}$ hydrocarbon radicals and $C_{(1-14)}$ hydrocarbon radicals substituted with radicals neutral during anionic or free radical polymerization and B is a polyvinylarylene block consisting essentially of chemically combined vinylarylene units substituted with at least one acid labile group of the formula,

OZ where Z is a tertiary organo or organosilicon acid labile radical, and x is a positive integer, and (D) an amount of a decomposable aryl onium salt which is sufficient to effect the anionic polymerization of the silicone-organic block polymer.

13. A composition in accordance with claim 12 with the polyvinylarylene block of the silicone-organic block polymer is a polystyrene block.

14. A resist composition in accordance with claim 12.

15. A photoresist composition in accordance with claim 12.

* * * * *